United States Patent [19]
Shirai

[11] Patent Number: 5,306,938
[45] Date of Patent: Apr. 26, 1994

[54] LATERAL MOSFET

[75] Inventor: Koji Shirai, Kitahyushu, Japan

[73] Assignee: Kabushiki Kaisha Toshiba, Kawasaki, Japan

[21] Appl. No.: 777,004

[22] Filed: Oct. 16, 1991

[30] Foreign Application Priority Data

Oct. 17, 1990 [JP] Japan .................. 2-280202

[51] Int. Cl.$^5$ .................. H01L 29/784; H01L 29/68
[52] U.S. Cl. .................. 257/344; 257/408
[58] Field of Search .................. 257/69, 122, 141, 146, 257/149, 203, 204, 205, 206, 274, 288, 338, 350, 351, 357, 365, 423, 511, 525, 526, 557, 575; 267/328, 337, 339; 275/335, 336, 141, 339, 376, 343, 344

[56] References Cited

U.S. PATENT DOCUMENTS

| | | | |
|---|---|---|---|
| 4,300,150 | 11/1981 | Colak | 257/336 |
| 4,661,838 | 4/1987 | Wildi et al. | 257/336 |
| 4,985,745 | 1/1991 | Kitahara et al. | 257/378 |
| 5,068,700 | 11/1991 | Yamaguchi et al. | 257/141 |
| 5,146,298 | 9/1992 | Eklund | 257/378 |

FOREIGN PATENT DOCUMENTS

| | | |
|---|---|---|
| 0356062 | 2/1990 | European Pat. Off. . |
| 0384396 | 8/1990 | European Pat. Off. . |
| 0386779 | 9/1990 | European Pat. Off. . |

OTHER PUBLICATIONS

European Search Report, EP 91 11 7653, Sep. 3, 1992.

Primary Examiner—Rolf Hille
Assistant Examiner—David B. Hardy
Attorney, Agent, or Firm—Finnegan, Henderson, Farabow, Garrett & Dunner

[57] ABSTRACT

A lateral MOSFET includes a back gate region, a part of its surface being a channel region. The back gate region surrounds the drain region, while being in contact with a part of the periphery of the drain region. With this configuration, when a high voltage electrostatic surge appears at the drain electrode, a surge current will disperse from the drain region toward the surrounding back gate region. As a result, a rise in the electric potential at the drain region is suppressed. Thus, the electric potential will not exceed the dielectric strength of the gate insulating film to suppress a breakdown of the gate insulating film and an electrostatic breakdown of the device.

4 Claims, 7 Drawing Sheets

LATERAL MOSFET

BACKGROUND OF THE INVENTION

1. Field of the Invention

The present invention relates to a lateral MOSFET and a manufacturing method thereof and, more particularly, to a double diffused lateral MOSFET (insulated-gate field effect transistor) applicable to a high withstand-voltage Bi-CMOS and manufacturing method thereof.

2. Description of the Related Art

In general, when a double diffused lateral MOSFET is composed of complementary MOS (CMOS), either a p-channel MOS transistor or an n-channel MOS transistor is formed as a lateral MOSFET.

Figure 1A:
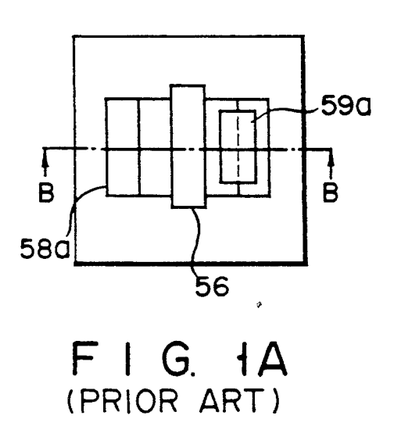
FIG. 1A is a plan view showing a plan pattern of a conventional lateral MOSFET.
Figure 1B:
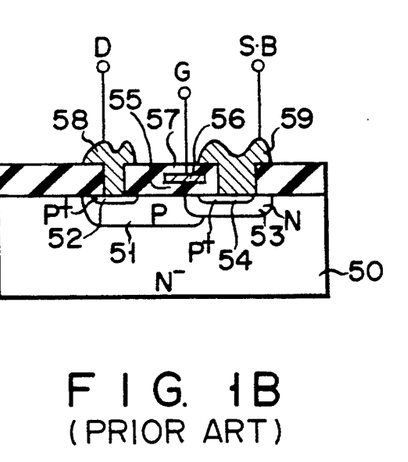
FIG. 1B is a sectional view of the lateral MOSFET of FIG. 1A taken along a line B—B.

FIG. 1A shows a pattern layout of a conventional lateral p-channel MOS transistor, and FIG. 1B is a sectional view taken along a line B—B of FIG. 1A. In FIGS. 1A and 1B, numeral 50 denotes an n⁻-type semiconductor substrate; 51, a p-type diffused layer for drain region; 52, a p⁺-type diffused layer for drain electrode connecting layer; 53, an n-type diffused layer for channel and back gate regions; 54, a p⁺-type diffused layer for source region; 55, a gate insulating film; 56, a gate electrode; 57, an interlayer insulating film; 58, a drain electrode; and 59, a source/back gate common electrode. The pattern is designed so that the gate electrode 56 may invariably exist between the contact portion 59a of the source/back gate common electrode 59 and drain contact portion 58a.

Figure 2:
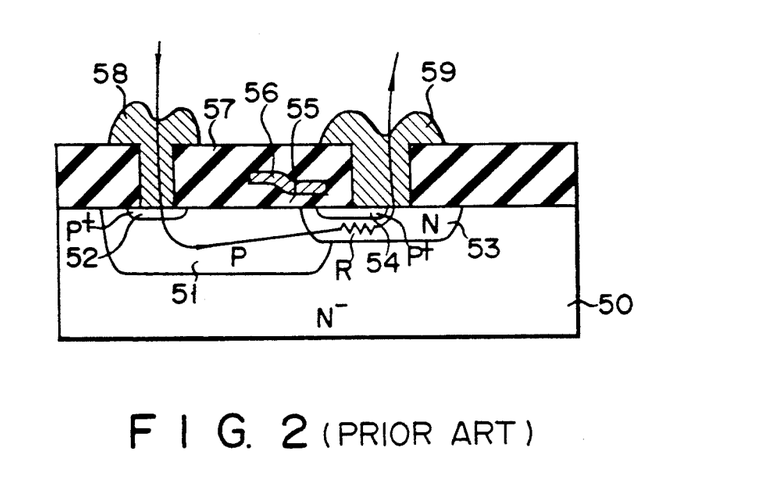
FIG. 2 is a sectional view illustrating a surge current path when an electrostatic surge enters the lateral MOSFET of FIG. 1B.

In such a conventional lateral MOSFET, when an electrostatic surge of high-voltage enters the drain electrode 58, a surge current flows in the forward direction of the parasitic diode, as shown by the arrow in FIG. 2. In other words, the surge current flows through the path from the p-type diffused layer 51 as the drain region to the n-type diffused layer 53 as the channel and back gate regions. At that time, an electric potential of the p-type diffused layer 51 increases due to the resistance R of the n-type diffused layer 53. A breakdown of the gate insulating film 55 occurs when the increased potential exceeds its dielectric strength. Thus, an electrostatic breakdown of the device also occurs.

SUMMARY OF THE INVENTION

The present invention is made to overcome the aforementioned drawbacks, and it is an object of the present invention to provide a lateral MOSFET and a manufacturing method thereof, in which a resistibility to electrostatic surge is improved and which can be used in a high withstand-voltage Bi-CMOS.

A lateral MOSFET according to the present invention comprises: a first impurity diffused layer of a second conductivity type formed at a part of the surface of a semiconductor substrate of a first conductivity type; a second impurity diffused layer of the second conductivity type located in the first impurity diffused layer and formed so as to have a less depth from the surface of the substrate to the junction and a higher impurity concentration than those of the first impurity diffused layer; a third impurity diffused layer of the first conductivity type with a higher impurity concentration than the semiconductor substrate, which is formed at a part of the surface of the semiconductor substrate so as to surround the first impurity diffused layer and the second impurity diffused layer, while being in contact with a part of the periphery of the first impurity diffused layer; a fourth impurity diffused layer of the second conductivity type located in the third impurity diffused layer in the area where the third impurity diffused layer contacts the first impurity diffused layer, and formed to have a less depth from the surface of the substrate to the junction than that of the third impurity diffused layer and have a higher impurity concentration than that of the first impurity diffused layer; a gate electrode formed via a gate insulting film on the surface of the third impurity diffused layer intervened between the fourth impurity diffused layer and first impurity diffused layer; a drain electrode formed in contact with the second impurity diffused layer; and a source/back gate common electrode formed in contact with both the third impurity diffused layer and fourth impurity diffused layer.

A high withstand-voltage Bi-CMOS transistor device according to the present invention comprises: a semiconductor substrate of a second conductivity type; a buried layer of a first conductivity type with a high impurity concentration, which is formed to be buried in the semiconductor substrate; an epitaxial layer of the first conductivity type formed in the semiconductor substrate and above the buried layer; a first impurity diffused layer of the first conductivity type, that is formed along the periphery of the epitaxial layer to reach the buried layer and has the impurity concentration equal to that of the buried layer and higher than that of the epitaxial layer; a second impurity diffused layer of the second conductivity type formed at a part of the surface of the epitaxial layer; a third impurity diffused layer of the second conductivity type with a higher impurity concentration than that of the second impurity diffused layer, which is located in the second impurity diffused layer and formed to have a less depth from the surface of the epitaxial layer to the junction than the second impurity diffused layer; a fourth impurity diffused layer of the first conductivity type with a higher impurity concentration than that of the epitaxial layer, which is formed at the surface of the epitaxial layer to surround the second impurity diffused layer and third impurity diffused layer and extend over the epitaxial layer and first impurity diffused layer, while being in contact with part of the periphery of the second impurity diffused layer; a fifth impurity diffused layer of the second conductivity type with a higher impurity concentration than that of the second impurity diffused layer, which is located in the fourth impurity diffused layer in the area where the fourth impurity diffused layer contacts the second impurity diffused layer and is formed to have a less depth from the surface of the epitaxial layer to the junction than that of the fourth impurity diffused layer; a gate electrode formed via a gate insulting film on the surface of the fourth impurity diffused layer intervened between the fifth impurity diffused layer and second impurity diffused layer; a drain electrode formed in contact with the third impurity diffused layer, and a source/back gate common electrode formed in contact with both the fourth impurity diffused layer and fifth impurity diffused layer; and a bipolar device formed in another surface region of the semiconductor substrate.

A high withstand-voltage Bi-CMOS transistor device according to the present invention comprises: a semiconductor substrate of a second conductivity type; a buried layer of a first conductivity type with a high impurity concentration, which is formed as a deep well in the semiconductor substrate; an epitaxial layer of the first conductivity type formed as a well in the buried layer; a first impurity diffused layer of the second conductivity type formed at a part of the surface of the epitaxial layer; a second impurity diffused layer of the second conductivity type with a higher impurity concentration than that of the first impurity diffused layer, which is located in the first impurity diffused layer and formed to have a less depth from the surface of the epitaxial layer to the junction than the first impurity diffused layer; a third impurity diffused layer of the first conductivity type with a higher impurity concentration than that of the epitaxial layer, which is formed at the surface of the epitaxial layer to surround the first impurity diffused layer and second impurity diffused layer and extend over the epitaxial layer and buried layer, while being in contact with a part of the periphery of the first impurity diffused layer; a fourth impurity diffused layer of the second conductivity type with a higher impurity concentration than that of the first impurity diffused layer, which is located in the third impurity diffused layer in the area where the third impurity diffused layer contacts the first impurity diffused layer and is formed to have a less depth from the surface of the epitaxial layer to the junction than that of the third impurity diffused layer; a gate electrode formed via a gate insulting film on the surface of the third impurity diffused layer intervened between the fourth impurity diffused layer and first impurity diffused layer; a drain electrode formed in contact with the second impurity diffused layer, and a source/back gate common electrode formed in contact with both the third impurity diffused layer and fourth impurity diffused layer; and a bipolar device formed in another surface region of the semiconductor substrate.

A method of manufacturing a lateral MOSFET according to the present invention comprises the steps of: forming a drain region by injecting impurities of a second conductivity type into the drain forming region of a semiconductor substrate of a first conductivity type and then diffusing them; forming gate insulating films in the back gate forming region, the drain electrode connecting layer forming region, and the source forming region on the semiconductor substrate; forming a gate electrode by depositing a polysilicon film over the entire surface and then patterning the deposited film; forming a back gate region by injecting impurities of the first conductivity type into the back gate forming region with the gate electrode as a mask and then diffusing the impurities; forming a drain electrode contact layer and source region by injecting impurities of the second conductivity type into the drain electrode contact forming region and source forming region and then diffusing the impurities; depositing an interlayer insulating film over the entire surface and then making openings for a source/back gate common electrode and a drain electrode; and forming a source/back gate common electrode and a drain electrode by evaporating a metal wiring layer on the entire surface and then patterning the evaporated layer.

In a lateral MOSFET according to the present invention, back gate region, a part of whose surface is a channel region, is formed to surround the drain region, while being in contact with a part of the periphery of the drain region. With this configuration, if a high voltage electrostatic surge invades the drain electrode, a surge current will disperse from the drain region toward the surrounding back gate region in every direction. As a result, a rise in the electric potential at the drain region is suppressed. Thus, the electric potential at the drain region hardly exceeds the dielectric strength of the gate insulating film, thereby increasing resistibility to electrostatic surges. This increased resistibility to the surge suppresses a breakdown of the gate insulating film and thus electrostatic breakdown of the device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the lateral MOSFET of the present invention will be explained in detail with reference to the accompanying drawings.

Figure 3A:
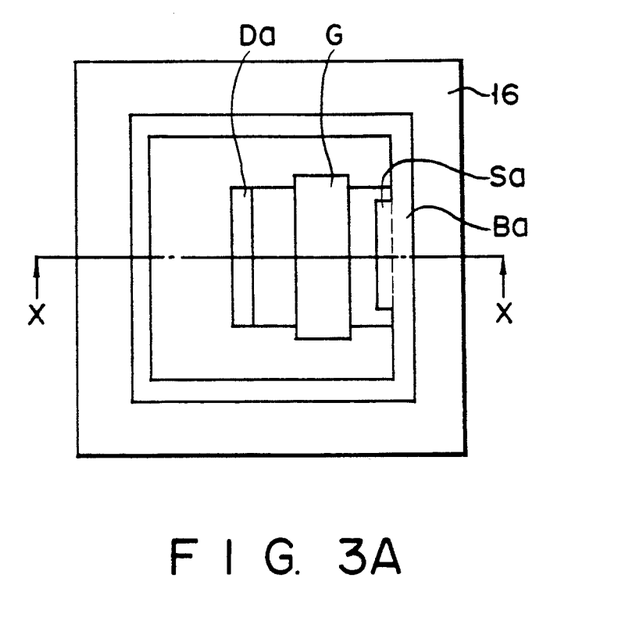
FIG. 3A is a plan view showing a plan pattern of a first embodiment of a lateral MOSFET according to the present invention.
Figure 3B:
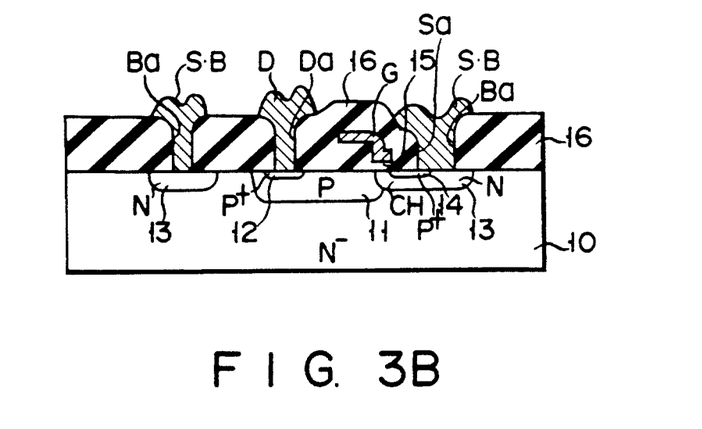
FIG. 3B is a sectional view taken along a line X—X of FIG. 3A.

FIG. 3A is a plan view showing a plan pattern of a first embodiment of a lateral MOSFET according to the present invention, and FIG. 3B is a sectional view taken along a line X—X of FIG. 3A. In FIG. 3A, reference character Ba denotes a back gate contact portion; Da, a drain contact portion; Sa, a source contact portion; and G, a gate electrode. The back gate contact portion Ba is provided around the drain contact portion Da. The source contact portion Sa is in contact with a part of the back gate contact portion Ba for common use.

In FIG. 3B, a semiconductor substrate 10 of a first conductivity type, i.e., n-type in the present invention, is an $n^-$-type semiconductor substrate with relatively low impurity concentration. The substrate 10 is made of, e.g., a silicon monocrystalline substrate. A drain region 11 is a first impurity diffused layer of a second conductivity type, i.e., p-type in the present invention, which is formed on the surface of the semiconductor substrate 10. A drain electrode connecting layer 12 is a second impurity diffused layer of a p+-type. The connecting layer 12 is located within the first impurity diffused layer 11 and has a less depth from the surface of the substrate 10 to the junction and has a higher impurity concentration than that of the diffused layer 11. A back gate region 13 is a third impurity diffused layer of an n-type with a higher impurity concentration than that of the semiconductor substrate 10. The back gate region 13 surrounds the first and second impurity diffused layers 11 and 12 on the surface of the semiconductor substrate 10, while being in contact with a part of the periphery of the first impurity diffused layer 11. A source region 14 is a fourth impurity diffused layer of a p+-type. The source region 14 is located in the third impurity diffused layer 13 in the area where the third impurity diffused layer 13 is in contact with the first impurity diffused layer 11. The source region 14 has a less depth from the surface of the substrate 10 to the junction than that of the third impurity diffused layer 13 and has a higher impurity concentration than that of the first impurity diffused layer 11. A gate electrode G is formed via a gate insulating film 15 on the channel region CH which is the surface region of the third impurity diffused layer 13 intervened between the fourth and first impurity diffused layers 14 and 11. The gate insulating film 15 is made of, for example, silicon dioxide ($SiO_2$) film. A drain electrode D is formed in contact with the second impurity diffused layer 12. A source/back gate common electrode SB is isolated from the drain contact portion Da while surrounding it, as shown in FIG. 3A, and is in contact with both the third and fourth impurity diffused layers 13 and 14, as shown in FIG. 3B. An interlayer insulating film 16 is formed of $SiO_2$, for example.

Now, referring to FIGS. 4A through 4M, a manufacturing method of the lateral p-channel MOS transistor in FIG. 3 will be described in detail.

Figure 4A:
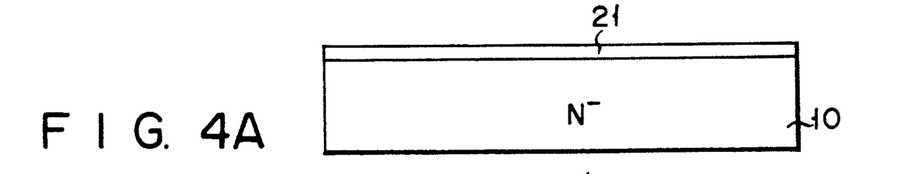
FIGS. 4A through 4M are sectional views illustrating the manufacturing processes of the lateral MOSFET of FIG. 3B.

As shown in FIG. 4A, an insulating film 21 is formed by dry oxidation at 1000° C. on the surface of the n⁻-type silicon substrate 10. The insulating film 21 is made of $SiO_2$ film of 0.1 μm thickness, for example.

Figure 4B:
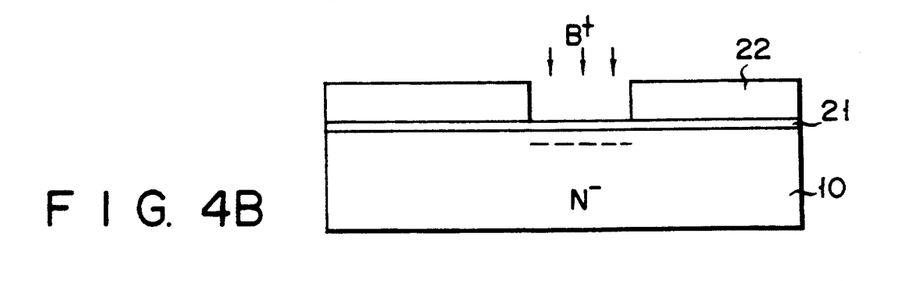

As shown in FIG. 4B, a photoresist pattern 22 is formed on the surface by photoetching. Then p-type impurities are injected into the entire surface by ion implantation. Boron ion is used as the p-type impurity.

Figure 4C:
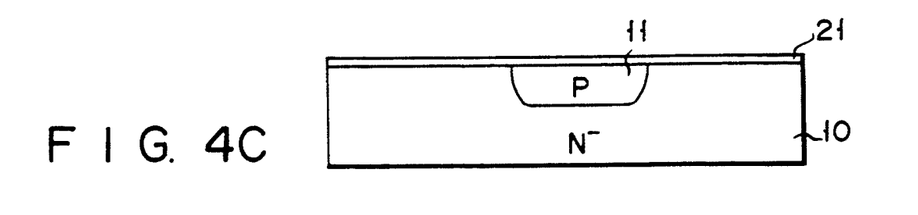

As shown in FIG. 4C, borons are diffused by heat treatment at 1200° C. to form the p-type impurity diffused layer 11. The diffused layer 11 is used as the drain region.

Figure 4D:
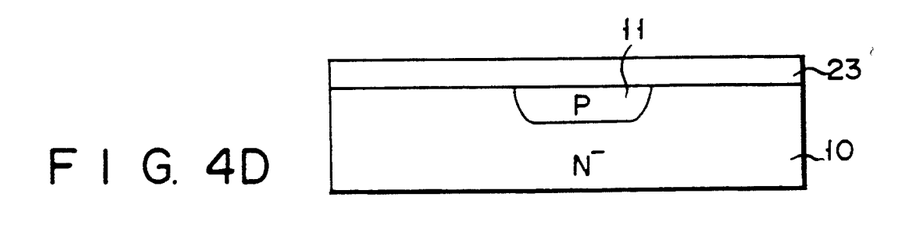

As shown in FIG. 4D, an insulating film ($SiO_2$) 23 is then grown to a thickness of 1.0 μm on the surface by steam oxidation at 1000° C.

Figure 4E:
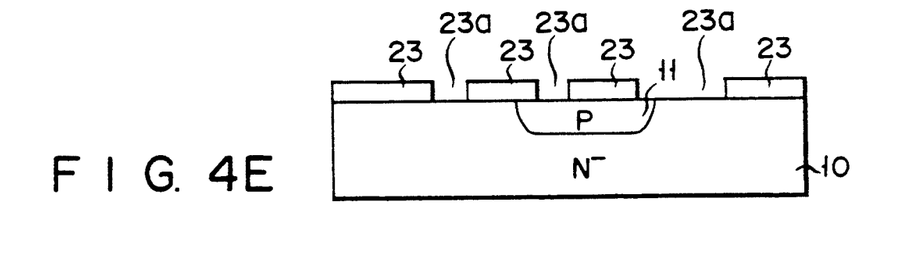

After the growth of the insulating film 23, as shown in FIG. 4E, openings 23a are formed by removing predetermined areas of the insulating film 23 by means of photoetching.

Figure 4F:
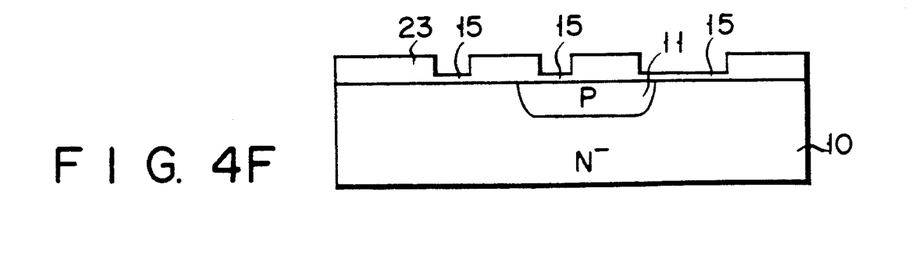

As shown in FIG. 4F, gate insulating films 15 are formed on the bottom of the openings 23a by dry oxidation at 1000° C. The gate insulating film 15 is made of $SiO_2$ film of 0.1 μm thickness, for example.

Figure 4G:
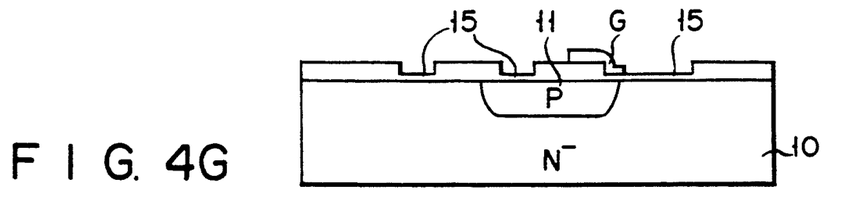

As shown in FIG. 4G, a polysilicon film is deposited to a thickness of 0.5 μm on the entire surface of the substrate by chemical vapor deposition (CVD). Then, the polysilicon film is patterned by photoetching to form the gate electrode G.

Figure 4H:
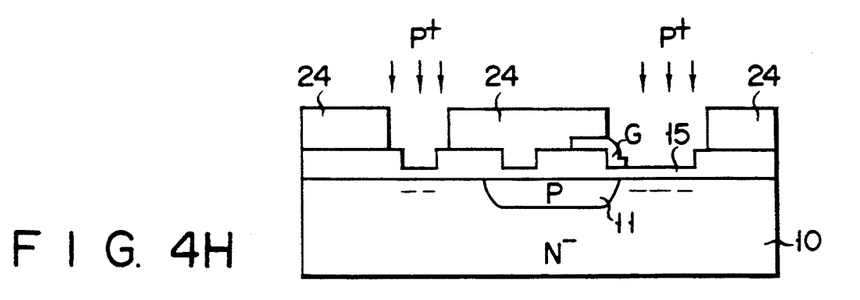

As shown in FIG. 4H, a photoresist pattern 24 is formed on the resultant surface by photoetching. N-type impurity ions are injected into the entire surface by ion implantation, using the photoresist pattern and the gate electrode G as a mask. Phosphorus ion P+ is used as the n-type impurity ion, for example.

Figure 4I:
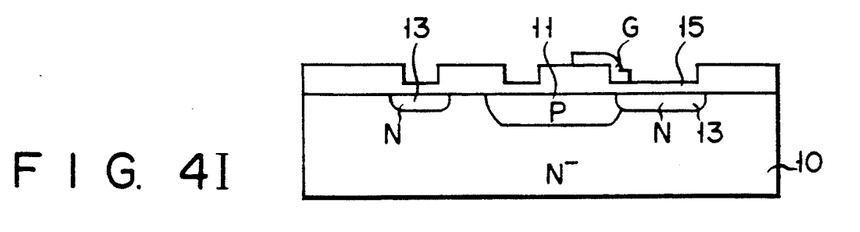

As shown in FIG. 4I, phosphori are diffused by heat treatment at 1200° C. to form the n-type impurity diffused layer 13. The diffused layer 13 is used as the back gate region.

Figure 4J:
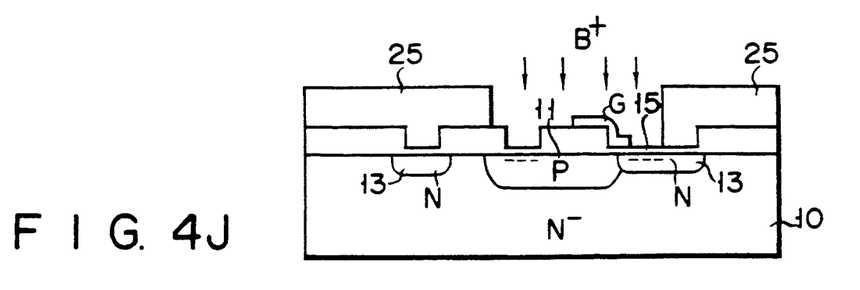

As shown in FIG. 4J, a photoresist pattern 25 is formed by photoetching on the surface. Then, boron ions B+ are implanted into the entire surface by ion implantation, using the photoresist pattern 25, the gate electrode G and the insulating film 23 as a mask.

Figure 4K:
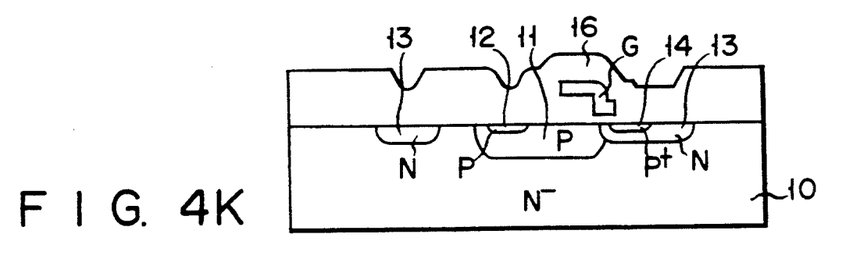

As shown in FIG. 4K, an interlayer insulating film ($SiO_2$) 16 is deposited to a thickness of 1.0 μm by CVD on the entire surface. Then, the interlayer insulating film 16 is annealed by heat treatment at 1000° C. Borons are diffused by the same heat treatment to form the p+-type impurity diffused layer 12 and the impurity diffused layer 14. The diffused layers 12 and 14 are used as the drain electrode connecting layer and the source region, respectively.

Figure 4L:
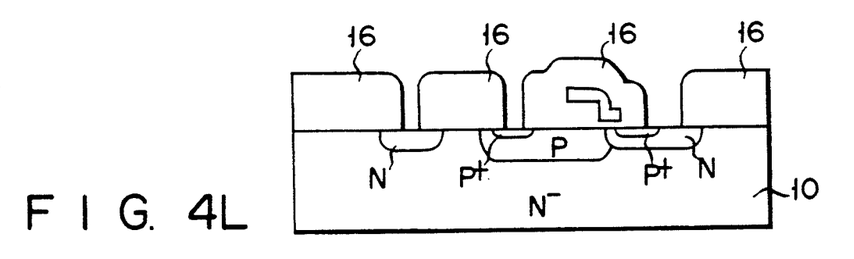

As shown in FIG. 4L, contact holes are formed by removing predetermined areas of the interlayer insulating film 16 by means of photoetching. These contact holes correspond to the back gate contact portion Ba, the drain contact portion Da, and the source contact portion Sa.

Figure 4M:
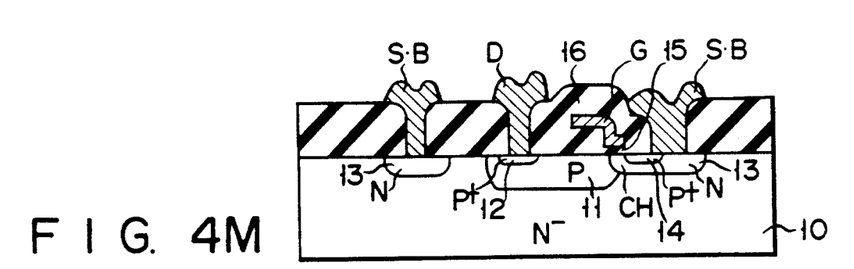

Finally, as shown in FIG. 4M, a metal wiring film such as Al film is deposited to a thickness of 1.0 μm over the surface of the resultant structure. The metal wiring film is then patterned by photoetching to form the drain electrode D and the source/back gate common electrode SB. The drain electrode D is in contact with the impurity diffused layer 12 as the drain electrode connecting layer. The common electrode SB is in contact not only with the whole back gate region 13 but also with the source region 14 which is formed in the area of the back gate region 13. After this, sintering is executed to complete the lateral MOSFET of FIG. 3B.

With the lateral p-channel MOSFET according to the first embodiment, the back gate region 13 is formed so as to surround the drain region 11 while being in contact with a part of the drain region 11. This arrangement allows a surge current to disperse from the drain region 11 to the surrounding back gate region 13. This suppresses a rise in the electric potential at the drain region 11. As a result, the electric potential value rarely exceeds the dielectric strength of the gate insulting film 15. Thus, a breakdown of the gate insulating film 15, and therefore an electrostatic breakdown of the device, is suppressed.

Figure 5A:
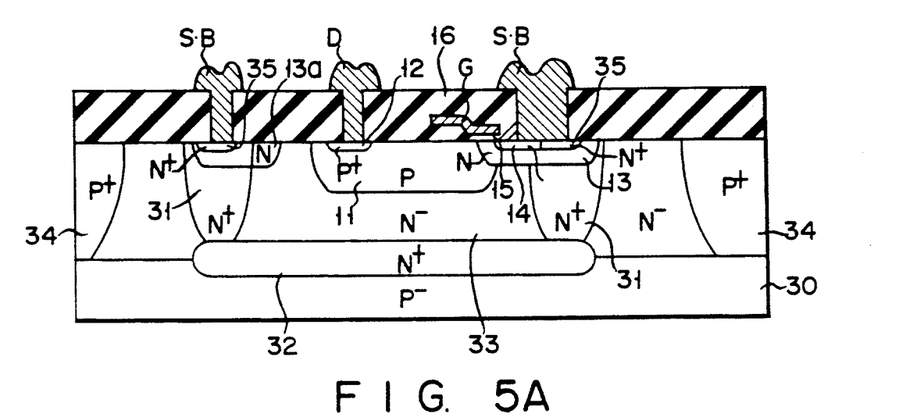
FIGS. 5A and 5B are sectional views showing a second embodiment as an integrated circuit according to the present invention.

FIG. 5A is a sectional view showing a lateral p-channel MOSFET according to a second embodiment of the present invention. FIG. 5A shows a sectional structure of the MOSFET as an integrated circuit. In FIG. 5A, a lateral p-channel MOS transistor is formed on an island of an n⁻-type epitaxial layer 33 which is surrounded by a deep n+-type diffused layer 31 and an n+-type buried layer 32 formed in a p⁻-type substrate 30. More particularly, first the n+-type buried layer 32 is formed in the p⁻-type substrate 30 and the n⁻-type epitaxial layer 33 is formed on the substrate 30 and the layer 32. A p+-type semiconductor region 34 as an element isolation region is formed at outer parts of the n⁻-type epitaxial layer 33. Further, in another part of the n⁻-type epitaxial layer 33, the deep n+-type diffused layer 31 reaching the n+-type buried layer 32 is formed On the n⁻-type-epitaxial layer 33 surrounded by both the deep n+-type diffused layer 31 and n+-type buried layer 32, a p-type diffused layer 11 is formed as the drain region. The n-type diffused layer 13 is then formed as the channel region/back gate region. The diffused layer 13 is in contact with part of the periphery of the p-type diffused layer 11 and partially located in the deep n+-type diffused layer 31. An n-type diffused layer 13a, i.e. a part of the n-type diffused layer 13, is formed as the back gate region and located in the deep n+-type diffused layer 31 such as to surround the p-type diffused layer 11. Here, numeral 12 denotes a p+-type diffused layer as the drain electrode connecting layer; 14, a p+-type diffused layer as the source region; 15, the gate insulating film; G, the gate electrode; D, the drain electrode; SB, the source/back gate common electrode; 16, the interlayer insulating film; and 35, an n+-type diffused layer as the back gate electrode connecting layer.

Figure 5B:
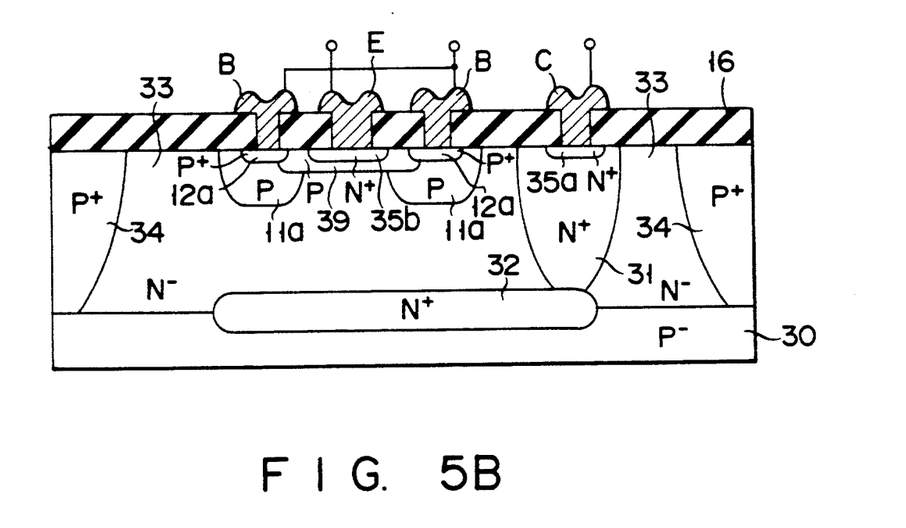

FIG. 5B shows a sectional structure of a bipolar device as an integrated circuit which is formed on the same p−-type substrate 30 as shown in FIG. 5A. The p−-type substrate 30, a deep n+-type diffused layer 31 as a buried collector electrode connecting layer, an n+-type buried layer 32 as a collector buried electrode, an n−-type epitaxial layer 33, and a p+-type semiconductor region 34 as a device isolation region are formed by the same steps as those in FIG. 5A. Also, an interlayer insulating film 16 is identical to that of FIG. 5A. A p-type diffused layer 11a as an external base region and a p+-type diffused layer 12a as a base electrode connecting layer are formed simultaneously with the drain region 11 and the drain electrode connecting layer 12 in FIG. 5A, respectively. An n+-type diffused layer 35a as a collector electrode connecting layer and n+-type diffused layer 35b as an emitter region are formed at the same time as the back gate electrode connecting layer 35 in FIG. 5A. A p-type diffused region 39 as a base region is formed between the steps for forming the external base region 11a and the emitter region 35b. More particularly, boron ions are injected as p-type impurity by ion implantation using another photoresist mask and then diffused simultaneously with the n-type diffused layer 13 in FIG. 5A. A base electrode B, an emitter electrode E, and a collector electrode C are formed simultaneously with the drain electrode D and the source/back gate common electrode SB in FIG. 5A.

Figure 6A:
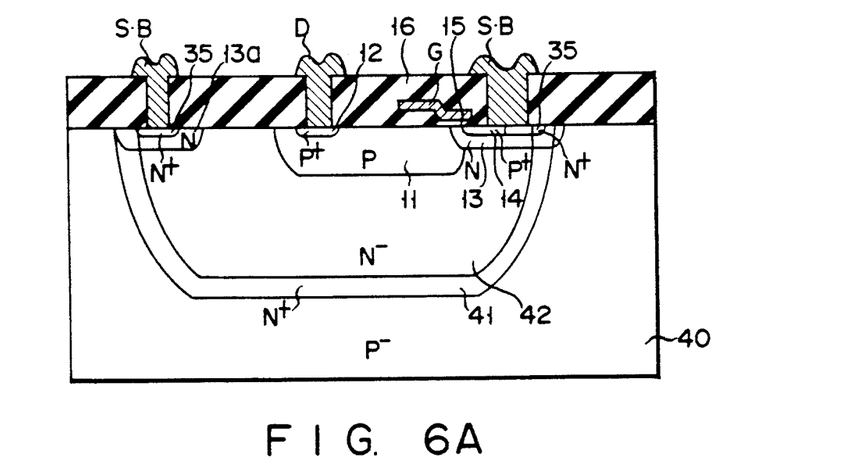
FIGS. 6A and 6B are sectional views showing a third embodiment as an integrated circuit according to the present invention.

FIG. 6A is a sectional view showing a lateral p-channel MOSFET according to a third embodiment of the present invention. FIG. 6A also shows a sectional structure of the MOSFET as an integrated circuit. In FIG. 6A, a lateral p-channel MOS transistor is formed on an island of a deep n−-type buried epitaxial layer 42 which is surrounded by an n+-type buried layer 41 on a p−-type substrate 40. More particularly, the convex n+-type buried layer 41 is first formed deeply in the p−-type substrate 40 and the n−-type buried epitaxial layer 42 is formed in the buried layer 41. A p-type diffused layer 11 is formed as the drain region in the epitaxial layer 42. An n-type diffused layer 13 is formed as the channel region/back gate region. The diffused layer 13 is in contact with part of the periphery of the p-type diffused layer 11 at the surface of the n−-type epitaxial layer 42, while being partially located in the n+-type buried layer 41. The n-type diffused layer 13a, i.e., a part of the n-type diffused layer 13, is formed as the back gate region at a part of the surface of the n−-type epitaxial layer 42 and at the surface of the n+-type buried layer 41 so as to surround the p-type diffused layer 11. Here, numeral 12 denotes a p+-type diffused layer as the drain electrode connecting layer; 14, a p+-type diffused layer as the source region; 15, the gate insulating film; G, the gate electrode; D, the drain electrode; SB, the source/back gate common electrode; 16, the interlayer insulting film,; and 35, an n+-type diffused layer as the back gate electrode connecting layer.

Figure 6B:
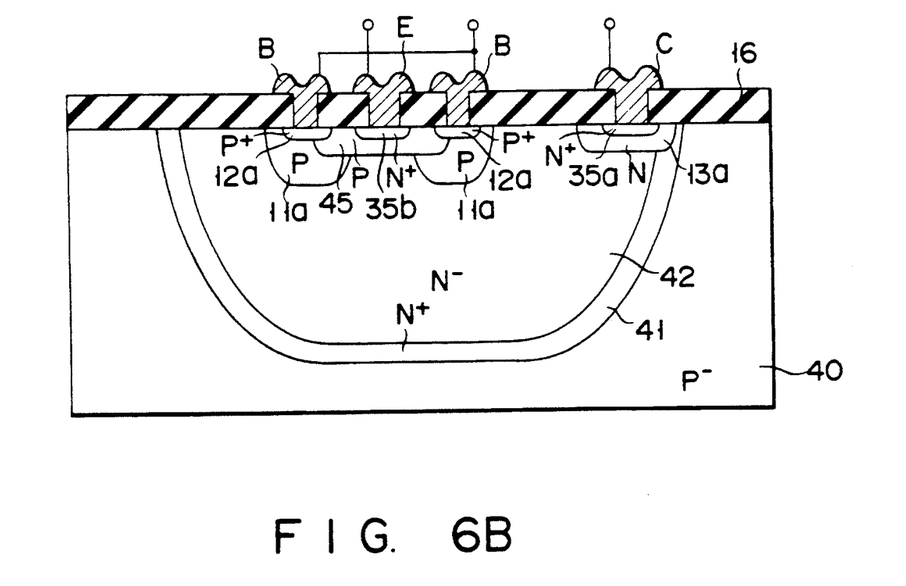

FIG. 6B shows a sectional structure of a bipolar device as an integrated circuit which is also formed on the same p−-type- substrate 40 as shown in FIG. 6A. The p−-type substrate 40, an n+-type buried layer 41 as a collector buried electrode, and a deep n−-type buried epitaxial layer 42 are formed by the same steps as those in FIG. 6A. An interlayer insulating film 16 is also identical to that of FIG. 6A. A p-type diffused layer 11a as an external base region, and an n-type diffused layer 13a are formed simultaneously with the drain region 11 and the channel region/back gate region 13 in FIG. 6A, respectively. A p+-type diffused layer 12a as a base electrode connecting layer is formed at the same time as the drain electrode connecting layer 12 in FIG. 6A. An n+-type diffused layer 35a as a collector electrode connecting layer and an n+-type diffused layer 35b as an emitter region are formed simultaneously with the back gate electrode connecting layer 35 in FIG. 6A. A p-type diffused region 45 as a base region is formed after the external base region 11a is formed. Boron ions are implanted and diffused simultaneously with the layer 13a to thus form the base region 45. A base electrode B, an emitter electrode E and a collector electrode C are also formed simultaneously with the drain electrode D and the source/back gate common electrode SB in FIG. 6A.

With lateral MOSFETs according to the present invention, it is possible to improve the resistibility to an electrostatic surge. Furthermore, the lateral MOSFET of the present invention can achieve the resistibility to an electrostatic surge of more than one thousand voltages, for example. A conventional lateral MOSFET has a resistibility to an electrostatic surge as low as up to several hundred voltages when no capacitive load is applied.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A lateral MOSFET comprising:

a semiconductor substrate of a first conductivity type having a surface;

a first impurity diffused layer of a second conductivity type formed at a first part of the semiconductor substrate;

a second impurity diffused layer of the second conductivity type disposed in the first impurity diffused layer, the second impurity diffused layer having a first depth from the surface of the substrate to a junction of the first impurity diffused layer and the second impurity diffused layer, the first depth of the second impurity diffused layer being smaller than the first impurity diffused layer, and the second impurity diffused layer having a higher impurity concentration than the first impurity diffused layer;

a third impurity diffused layer of the first conductivity type having a higher impurity concentration than the semiconductor substrate, the third impurity diffused layer being formed at a second part of the surface of the semiconductor substrate and surrounding both the first impurity diffused layer and the second impurity diffused layer, the third impurity diffused layer being in contact with a part of a periphery of the first impurity diffused layer;

a fourth impurity diffused layer of the second conductivity type disposed in the third impurity diffused layer adjacent an area where the third impurity diffused layer contacts the first impurity diffused layer, the fourth impurity diffused layer having a second depth from the surface of the substrate to a junction of the third impurity diffused layer and the fourth impurity diffused layer, the second depth of the fourth impurity diffused layer being smaller than the third impurity diffused layer, and the fourth impurity diffused layer having a higher impurity concentration than the first impurity diffused layer;

a gate insulating film on a surface of the third impurity diffused layer, the third impurity diffused layer intervening between the fourth impurity diffused layer and the first impurity diffused layer;

a gate electrode formed on the surface of the third impurity diffused layer through the gate insulating film;

a drain electrode formed in contact with the second impurity diffused layer; and a source and back gate common electrode formed in contact with both the third impurity diffused layer and the fourth impurity diffused layer.

2. A lateral MOSFET according to claim 1, wherein said semiconductor substrate is a silicon monocrystalline substrate and said gate insulating film is a silicon dioxide film.

3. A high breakdown voltage Bi-CMOS transistor device comprising:

a buried layer of a first conductivity type having a high impurity concentration;

a semiconductor substrate of a second conductivity type, the buried layer being buried in a region of the semiconductor substrate;

an epitaxial layer of the first conductivity type formed in the semiconductor substrate and above the buried layer;

a first impurity diffused layer of the first conductivity type formed along a periphery of the epitaxial layer and reaching the buried layer, the first impurity diffused layer having an impurity concentration substantially equal to the impurity concentration of the buried layer and higher than an impurity concentration of said epitaxial layer;

a second impurity diffused layer of the second conductivity type formed at a part of a surface of said epitaxial layer;

a third impurity diffused layer of the second conductivity type having a higher impurity concentration than an impurity concentration of said second impurity diffused layer, the third impurity diffused layer being disposed in the second impurity diffused layer and having a first depth from the surface of said epitaxial layer to a junction of the second impurity diffused layer and the third impurity diffused layer, the first depth being smaller than the second impurity diffused layer;

a fourth impurity diffused layer of the first conductivity type having a higher impurity concentration than the impurity concentration of the epitaxial layer, the fourth impurity diffused layer being formed at another part of the surface of the epitaxial layer and surrounding both the second impurity diffused layer and the third impurity diffused layer, the fourth impurity diffused layer extending over the epitaxial layer and first impurity diffused layer and being in contact with a part of a periphery of the second impurity diffused layer;

a fifth impurity diffused layer of the second conductivity type having a higher impurity concentration than the impurity concentration of the second impurity diffused layer, the fifth impurity diffused layer being disposed in the fourth impurity diffused layer adjacent an area where the fourth impurity diffused layer contacts the second impurity diffused layer and having a second depth from the surface of the epitaxial layer to a junction of the fourth impurity diffused layer and the fifth impurity diffuse layer, the second depth being smaller than the fourth impurity diffused layer;

a gate insulating film on a surface of the fourth impurity diffused layer, the fourth impurity diffused layer intervening between the fifth impurity diffused layer and the second impurity diffused layer;

a gate electrode formed on the surface of the fourth impurity diffused layer through the gate insulating film;

a drain electrode formed in contact with the third impurity diffused layer;

a source and back gate common electrode formed in contact with both the fourth impurity diffused layer and the fifth impurity diffused layer; and a bipolar device formed in another region of the semiconductor substrate.

4. A high breakdown voltage Bi-CMOS transistor device comprising:

a buried layer of a first conductivity type having a high impurity concentration;

a semiconductor substrate of a second conductivity, the buried layer being formed as a deep well in the semiconductor substrate;

an epitaxial layer of the first conductivity type formed in said buried layer;

a first impurity diffused layer of the second conductivity type formed at a part of a surface of the epitaxial layer;

a second impurity diffused layer of the second conductivity type having a higher impurity concentration than an impurity concentration of the first impurity diffused layer, the second impurity diffused layer being disposed in the first impurity diffused layer and having a first depth from the surface of said epitaxial layer to a junction of the first impurity diffused layer and the second impurity diffused layer, the first depth being smaller than the first impurity diffused layer;

a third impurity diffused layer of the first conductivity type having a higher impurity concentration than an impurity concentration of the epitaxial layer, the third impurity diffused layer being formed at the surface of said epitaxial layer and surrounding both the first impurity diffused layer and the second impurity diffused layer, the third impurity diffused layer extending over the epitaxial layer and buried layer and being in contact with a part of a periphery of the first impurity diffused layer;

a fourth impurity diffused layer of the second conductivity type having a higher impurity concentration than the impurity concentration of the first impurity diffused layer, the fourth impurity diffused layer being located int eh third impurity diffused layer adjacent an area where the third impurity diffused layer contacts the first impurity diffused layer and having a second depth from the surface of said epitaxial layer to a junction of the third impurity diffused layer and the fourth impurity diffused layer, the second depth being smaller than the third impurity diffused layer;

a gate insulating film on the surface of the third impurity diffused layer, the third impurity diffused layer intervening between the fourth impurity diffused layer and the first impurity diffused layer;

a gate electrode formed on the surface of the third impurity diffused layer through the gate insulating film;

a drain electrode formed in contact with the second impurity diffused layer;

a source and back gate common electrode formed in contact with both the third impurity diffused layer and fourth impurity diffused layer; and a bipolar device formed in another region of the semiconductor substrate.

* * * * *

UNITED STATES PATENT AND TRADEMARK OFFICE
CERTIFICATE OF CORRECTION

PATENT NO. : 5,306,938
DATED : April 26, 1994
INVENTOR(S) : Koji Shirai

It is certified that error appears in the above-indentified patent and that said Letters Patent is hereby corrected as shown below:

Title Page    Inventor, change "Kitahyushu" to --Kitakyushu--.

Claim 3, column 10, line 20, change "diffuse" to --diffused--.

Claim 4, column 11, line 5, change "int eh" to --in the--.

Signed and Sealed this

Seventeenth Day of January, 1995

Attest:

BRUCE LEHMAN

*Attesting Officer*    *Commissioner of Patents and Trademarks*